United States Patent
Summers et al.

(10) Patent No.: US 7,359,210 B2
(45) Date of Patent: Apr. 15, 2008

(54) SHOCK ABSORBING SYSTEM FOR CIRCUIT BOARDS

(75) Inventors: Mark D. Summers, Phoenix, AZ (US); Edoardo Campini, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 244 days.

(21) Appl. No.: 11/092,253

(22) Filed: Mar. 29, 2005

(65) Prior Publication Data

US 2006/0221588 A1    Oct. 5, 2006

(51) Int. Cl.
    *H05K 7/14* (2006.01)
(52) U.S. Cl. ............... 361/758; 361/770; 361/804; 361/796; 361/752
(58) Field of Classification Search ......... 361/788, 361/796, 797, 730, 752, 742, 758, 770, 804, 361/807; 174/50, 520, 521; 211/41.17
    See application file for complete search history.

(56) References Cited

U.S. PATENT DOCUMENTS 4,386,390 A * 5/1983 Hammond .............. 361/804
5,812,374 A * 9/1998 Shuff .................... 361/704
6,275,374 B1 * 8/2001 Shin et al. ............... 361/680

OTHER PUBLICATIONS

Advanced Mezzanine Card Short Form Specification, PICMG AMC.0, (Jun. 15, 2004), 57 pages.
PCI Industrial Computers: Advanced TCA. PICMG 3.0 Short Form Specification. Jan. 2003, 34 pgs.

* cited by examiner

*Primary Examiner*—Tuan T. Dinh
*Assistant Examiner*—Dameon E Levi
(74) *Attorney, Agent, or Firm*—Grossman, Tucker, Perreault & Pfleger, PLLC

(57) ABSTRACT

A shock absorbing system may be mounted on a circuit board, such as a carrier card, to reinforce the circuit board and/or to absorb shock forces from a neighboring circuit board, such as a mezzanine card coupled to the carrier card. The shock absorbing system may include one or more support members extending across at least a portion of the carrier card. One or more rollers may be supported on the support member(s) in a manner that allows rotation to facilitate insertion and/or extraction of mezzanine cards from the carrier card. Of course, many alternatives, variations, and modifications are possible without departing from this embodiment.

19 Claims, 6 Drawing Sheets

SHOCK ABSORBING SYSTEM FOR CIRCUIT BOARDS

FIELD

The present disclosure relates to a shock absorbing system, apparatus, and method for circuit boards such as an Advanced Mezzanine Card (AdvancedMC) carrier.

BACKGROUND

In computer systems, computer component cards may be connected to a single base or carrier card that plugs into a computer bus or data path. The component cards may be stacked on the base or carrier card and are commonly referred to as mezzanine cards. A component (or mezzanine) card may provide "add on" functionality such as telecom connectivity, processors, network communication processors, network communications co-processors and mass storage. A carrier card may connect to a backplane in a computer system and may communicate with the component card(s) connected to the carrier card. An Advanced Mezzanine Card (AdvancedMC) is a high-speed, hot-swappable mezzanine card that is compatible with, but not limited to, use with Advanced Telecommunications Computing Architecture (ATCA) carriers. The AdvancedMC standard is designed to enhance modularity and high-speed serial connectivity for ATCA and other platforms.

Assembled carrier and mezzanine cards may be susceptible to damage, for example, during shipping or transportation. In particular, existing AdvancedMC and carrier card support mechanisms may not be strong enough to support heavier AMCs (e.g., over 250 g). One example of a heavier AdvancedMC is an AdvancedMC including a hard drive. Shock and vibration tests have shown that damage may result, such as cracked AdvancedMC connectors, bent faceplates, and damaged carrier card components. To avoid damage, existing systems may need to be disassembled, packaged, shipped and then re-assembled at its destination, which may not be a practical solution.

BRIEF DESCRIPTION OF DRAWINGS

Features and advantages of the claimed subject matter will be apparent from the following detailed description of embodiments consistent therewith, which description should be considered with reference to the accompanying drawings, wherein:

Although the following Detailed Description will proceed with reference being made to illustrative embodiments, many alternatives, modifications, and variations thereof will be apparent to those skilled in the art. Accordingly, it is intended that the claimed subject matter be viewed broadly.

DETAILED DESCRIPTION

Figure 1:
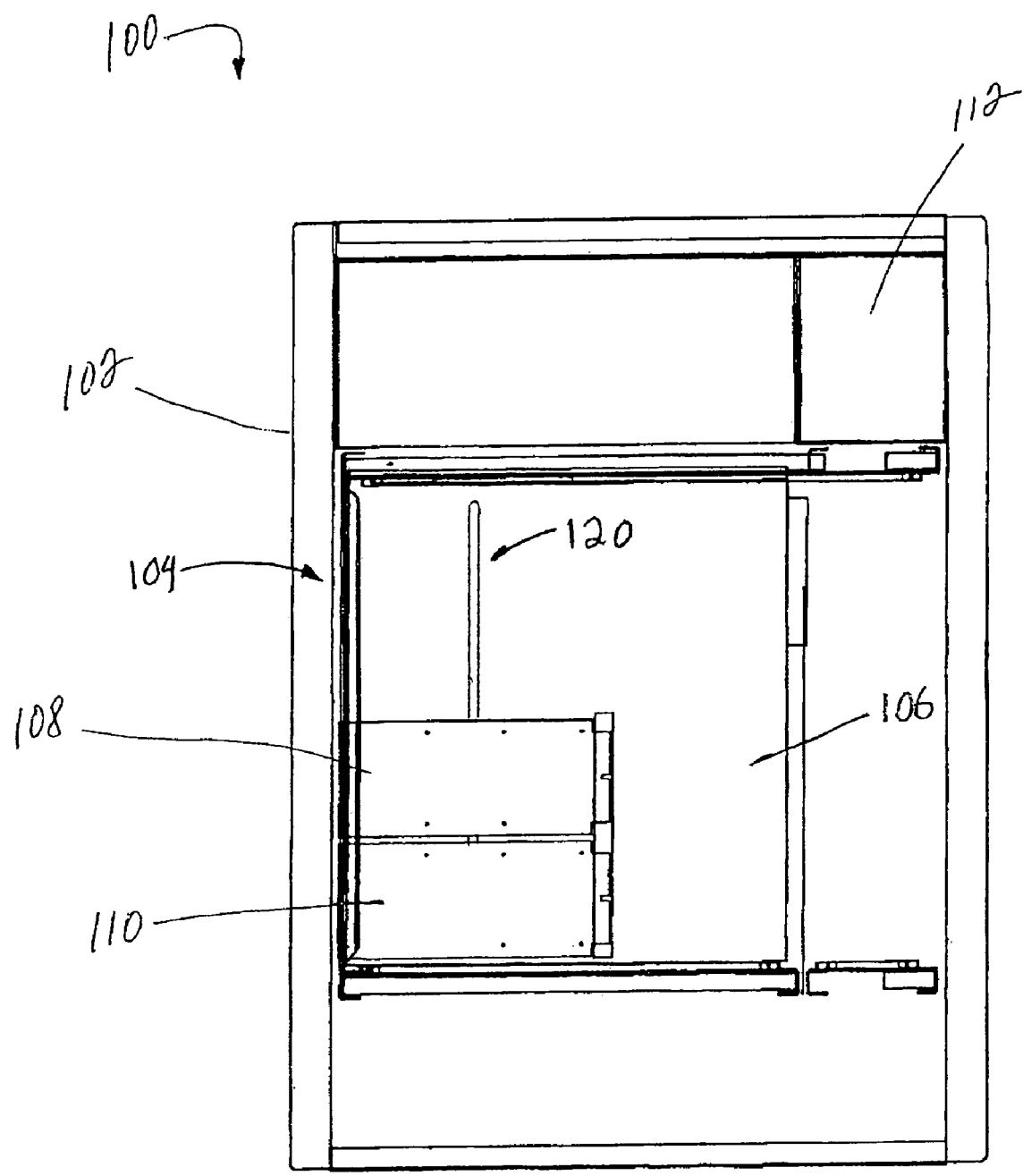
FIG. 1 is a schematic diagram of a computer system capable of housing circuit boards, consistent with the present disclosure.

With reference to FIG. 1, an embodiment of a computer system 100 is depicted. The computer system 100 may generally include a chassis 102 housing one or more printed circuit boards 104 such that the printed circuit board(s) 104 may be at least partially disposed in the chassis 102. The printed circuit board(s) 104 may be mechanically and/or electrically coupled to the chassis 102. At least one of the circuit boards 104 may be a carrier card 106, and one or more "add on" circuit boards or mezzanine cards 108, 110 may be electrically and/or physically coupled to the carrier card 106. The mezzanine cards 108, 110 may include various components, such as a processor, memory module, or other component. A shock absorbing system 120 may be mounted to the carrier card 106 to provide reinforcement of the carrier card 106 and/or to provide additional support for the mezzanine cards 108, 110 coupled to the carrier card 106, as will be described in greater detail below.

The system 100 may additionally include one or more fans 112 associated with a cooling system. The fans 112 may produce a flow of air through the chassis 102 to provide convective cooling of the circuit boards 104, mezzanine cards 108, 110 and/or other components disposed within the chassis 102. According to one embodiment, the chassis 102 may be an advanced telecommunications computing architecture (advanced TCA or ATCA) chassis, complying with, or compatible with, PCI Industrial Computer Manufacturers Group (PICMG), rev. 3.0, Advanced Telecommunications Computing Architecture (ATCA), published Dec. 30, 2002. ATCA provides a standardized modular platform and aspects of ATCA include mechanical components, shelf management, power distribution, thermal, and data transport.

According to one embodiment, each of the mezzanine cards 108, 110 may be an advanced mezzanine card (AdvancedMC) complying with and/or compatible with PCI Industrial Computer Manufacturers Group (PICMG), Advanced Mezzanine Card (AdvancedMC) Base Specification, PICMG AMC.0, published Jan. 3, 2005 (the "AdvancedMC Specification"). The shock absorbing system 120 may be implemented as a "Specification Plus" technology, which is a superset of ATCA/AdvancedMC while retaining backwards compatibility with existing AdvancedMC mezzanines and ATCA blades. A shock absorbing system consistent with the present disclosure may also be used in environments other than ATCA or AdvancedMC.

Figure 2:
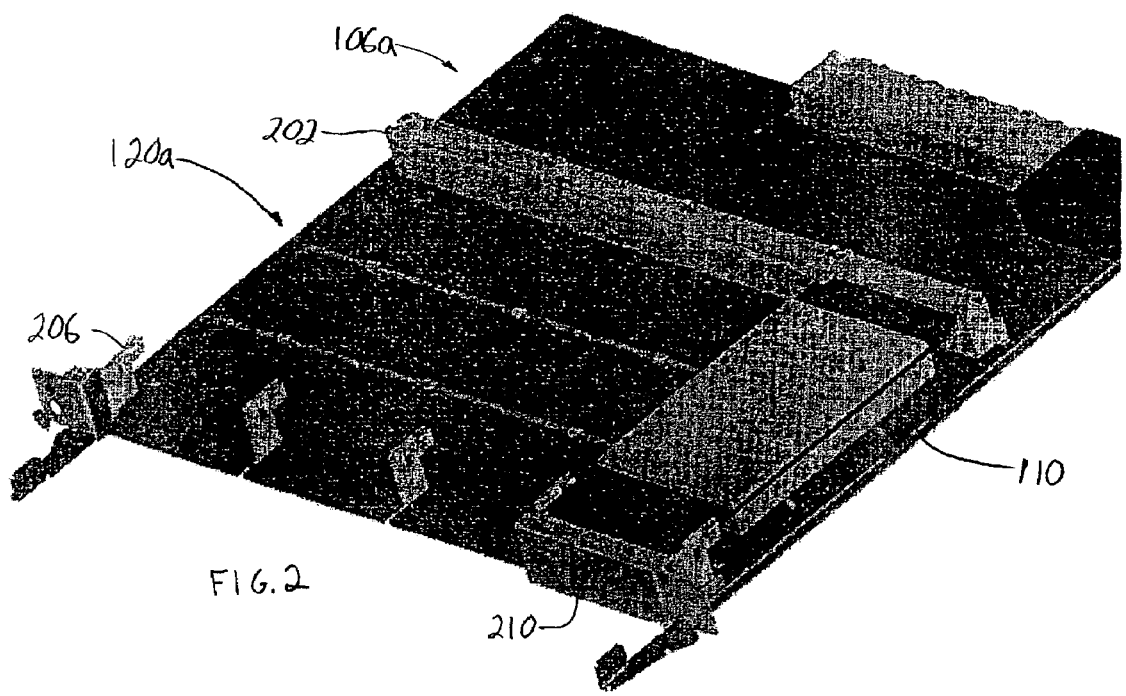
FIG. 2 is a perspective view of a carrier card and mezzanine card assembly that may be used in the system of FIG. 1.
Figure 3:
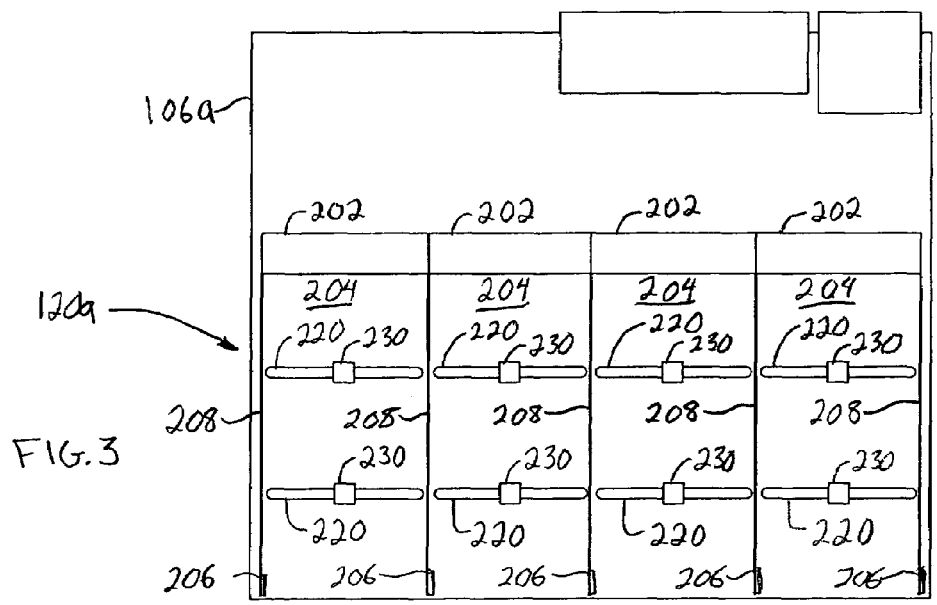
FIG. 3 is a schematic diagram of a carrier card including a shock absorbing system consistent with the present disclosure.

One embodiment of a carrier card 106a with a shock absorbing system 120a is shown in greater detail in FIGS. 2 and 3. The carrier card 106a may include one or more mezzanine card connectors 202 corresponding to one or more mezzanine card sites 204 on the carrier card 106a. The mezzanine card connectors 202 may electrically connect to and support one end of the mezzanine cards located in the mezzanine card sites 204. Although the exemplary embodiment of the carrier card 106a shown in FIG. 2 only includes one mezzanine card 110, mezzanine cards may be located in each of the mezzanine card sites 204 on the carrier card 106a.

One or more struts 206 may be mounted to the carrier card 106a to support the other end of the mezzanine cards located in the mezzanine card sites 204. The carrier card 106a may also include one or more guide rails 208 (shown in FIG. 3) extending between the mezzanine connectors 202 and the struts 206 to facilitate insertion and/or extraction of the mezzanine cards in one or more of the mezzanine card sites 204. One or more faceplates 210 (shown in FIG. 2) may also be mounted to the carrier card 106a to cover one end of the mezzanine card 110 inserted in one of the mezzanine card sites 204.

According to one embodiment, the shock absorbing system 120a may include one or more support members 220 that extend at least partially across one or more of the mezzanine card sites 204 on the carrier card 106a. One or more rollers 230 may be supported on the support members 220 in a manner that allows rotation of the roller(s) 230 to facilitate insertion and/or extraction of the mezzanine cards. The support member(s) 220 and/or roller(s) 230 may be configured to provide additional support for the mezzanine cards coupled to the carrier card 106a at each of the mezzanine card sites 204. By extending across the mezzanine card sites 204, the support members 220 may also stiffen the carrier card 106a and distribute loads applied by the mezzanine cards, for example, during shocks and/or vibrations.

In the illustrated exemplary embodiment, each of the support members 220 extends across one of the mezzanine card sites 204. The length of each of the support members 220 may thus correspond to the width of the mezzanine cards. On an AdvancedMC carrier, for example, the length of each of the support members 220 may correspond to the width of a single-wide AdvancedMC (approximately 74 mm) or the width of a double-wide AdvancedMC (approximately 149 mm). Alternatively, a single support member may extend across multiple mezzanine card sites 204. Alternative configurations for the support members are described in greater detail below.

The support member(s) 220 may also be configured to accommodate the guide rails 208 between the mezzanine sites 204. When each of the support members 220 extends across a single one of the mezzanine card sites 204, for example, the support members 220 may be spaced to accommodate the guide rails 208 and to butt against the guide rails 208. When a single support member 220 extends across multiple mezzanine card sites 204, the single support member 220 may include notches (not shown) to accommodate the guide rails 208.

In the illustrated exemplary embodiment, each of the support members 220 in each of the mezzanine card sites 204 supports a roller 230. Alternatively, each of the support members 220 may support multiple rollers. Where a single support member extends across multiple mezzanine sites 204, for example, multiple rollers 230 may be supported on the single support member and located within the respective mezzanine card sites 104. According to another alternative, one or more support members 220 may be used without rollers supported thereon.

Figure 4:
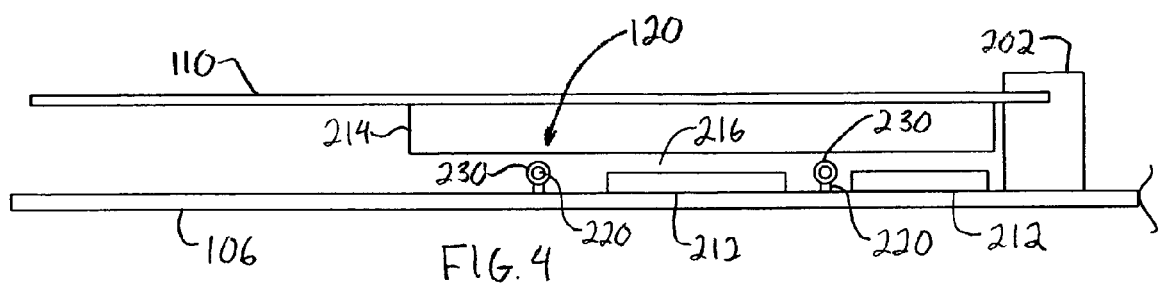
FIG. 4 is a side view of a carrier card and mezzanine card assembly including a shock absorbing system consistent with the present disclosure.
Figure 5:
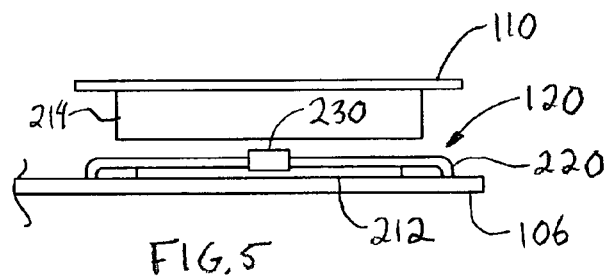
FIG. 5 is an end view of the carrier card and mezzanine card assembly shown in FIG. 4.

As shown in greater detail in FIGS. 4 and 5, the shock absorbing system 120 may be configured between the carrier card 106 and the mezzanine card 110 to receive and absorb shock forces from the mezzanine card 110 if the mezzanine card 110 moves toward the carrier card 106. The carrier card 106 may include one or more carrier card components 212, such as processors, memory modules, communications modules, and the like. The mezzanine card 110 may include one or more mezzanine card components 214 such as processors, memory modules, storage devices, and the like. When the mezzanine card 110 is connected to the carrier card 106, there may be a clearance 216 between the components 212, 214, for example, in the range of about 0.5 mm.

In one embodiment, the shock absorbing system 120 may extend from the carrier card 106 above the carrier card component 212 and into the clearance 216. The shock absorbing system 120 is thus configured to contact the mezzanine card component 214 if shock forces and/or vibrations cause the mezzanine card component 214 to move toward the carrier card component 212. The shock absorbing system 120 may thus act as a snubber absorbing shock forces from the mezzanine card component 214 and preventing damage to the carrier card component 212. The shock absorbing system 120 may also be configured to contact the mezzanine card components 214 when the mezzanine card 110 is at rest.

According to the illustrated exemplary embodiment, each of the support members 220 may be mounted to the carrier card 106 such that each of the support members 220 is raised above the carrier card 106 (see FIG. 5). This may minimize the impact to the carrier card components 212 mounted on the carrier card 106 below the mezzanine card 110 and allows the roller(s) 230 to spin around the support member(s) 220. According to the illustrated exemplary embodiment, the top surface of the roller 230 may be located in the clearance 216 above the carrier card components 212 and below the mezzanine card components 214 such that the roller 230 contacts the mezzanine card components 214 and receives the shock forces. The distance that the support member 220 and/or roller 230 extends above the carrier card 106 may depend on the height of the carrier card component(s) 212. On an AdvancedMC carrier, for example, components on the back of the carrier board may be as high as 5.5 mm and components on the front of the carrier board may be as high as 2.14 mm. In one embodiment, the support member 220 and/or roller 230 may extend from the carrier card 106 in a range of about 2.14 mm to 6 mm.

In the illustrated exemplary embodiment, each of the mezzanine card sites 204 includes two of the support members 220 located on the carrier card 106 below the mezzanine card component(s) 214 on the mezzanine card 110. The support members 220 may be located below the heaviest mezzanine card components. Where the mezzanine card component 214 is a hard drive weighing more than about 250 grams, for example, two support members 220 may be located beneath the hard drive. The number of support members 220 within each of the mezzanine card sites 204 may depend on the number, size and weight of the components 214 on the mezzanine card. The location of the support members 220 within each of the mezzanine card sites 204 may also depend on the location of the components 212 on the carrier card and the location of components 214 on the mezzanine card.

Figure 6:
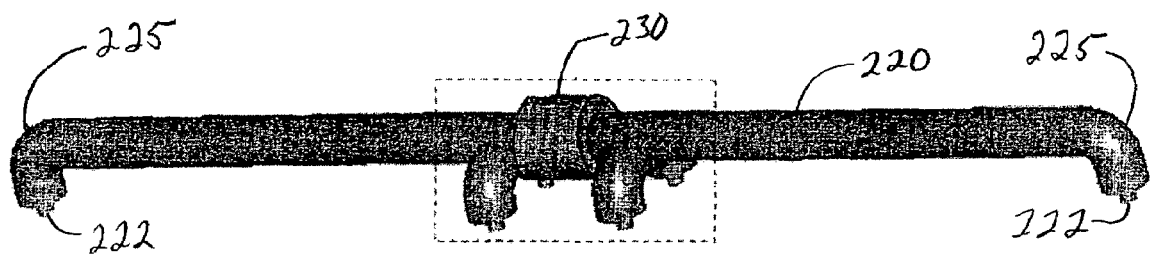
FIG. 6 is a side view of a support member that may be used in one embodiment of the shock absorbing system consistent with the present disclosure.
Figure 7:
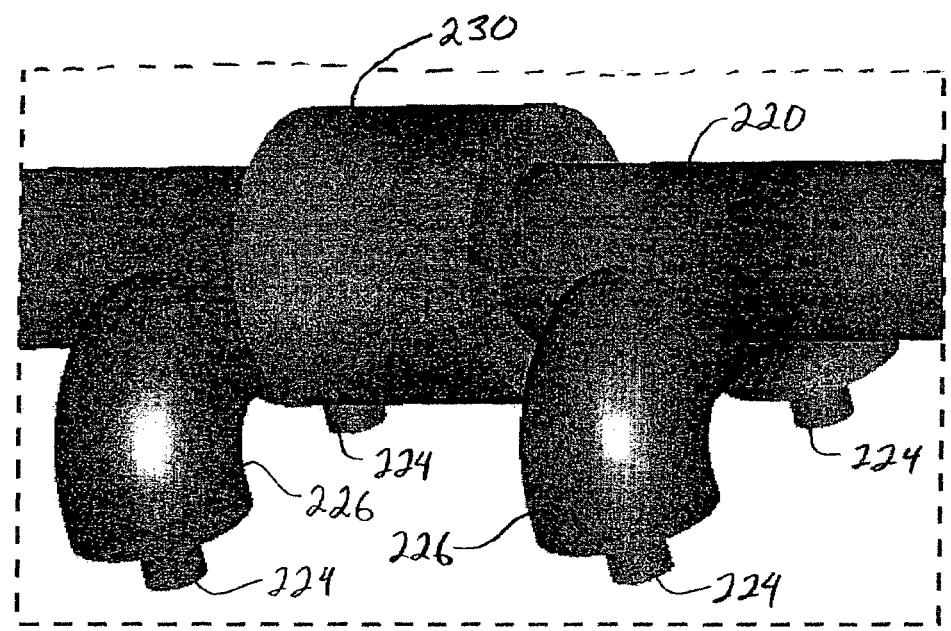
FIG. 7 is an enlarged side view of a roller on the support member shown in FIG. 6.
Figure 8:
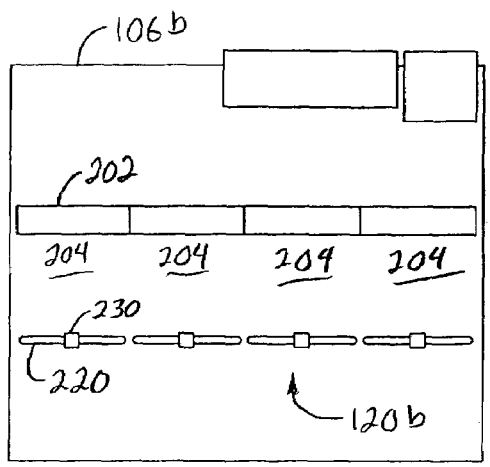
FIGS. 8-11 are schematic diagrams of embodiments of carrier cards including shock absorbing systems having various configurations consistent with the present disclosure.
Figure 9:
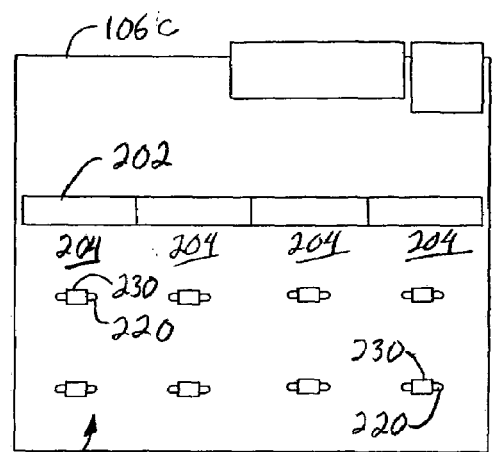
Figure 10:
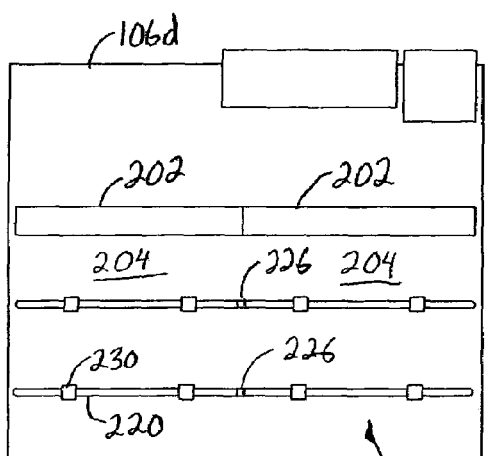
Figure 11:
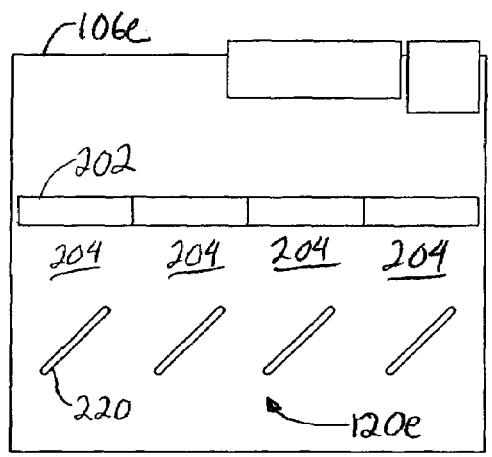

As shown in FIGS. 6 and 7, one embodiment of the support member 220 may be a metal bar having mounting structures 222, 224, such as pins, engaging holes in the circuit board. Mounting structures 222 may be located at the ends of the support member 220. Mounting structures 224 may also be located at a mid section of the support member 220, for example, on either side of the roller 230. The support member 220 may also include side supports 226 extending from each side of the support member 220, for example, on each side of the roller 230, to provide added stability, stiffening and load distribution. In the exemplary embodiment, the support member 220 may be a cylindrical bar with curved ends 225 and curved side supports 226. Those skilled in the art will recognize that the support member 220 may have other shapes and may also be mounted in other ways.

The rollers 230 mounted on the support member 220 may be made of any material capable of absorbing shock forces including, but not limited to, elastomeric materials. According to an alternative embodiment, the support members 220 may not include rollers 230 supported thereon and may be made of or coated with a lubricious material, such as Teflon, which facilitates the sliding of mezzanine cards. Those skilled in the art will recognize that other materials may be used for either the support member 220 or the roller 230.

According to a further embodiment, the support member 220 may also be used as a power distribution bus bar on the carrier card 106. In this embodiment, the roller 230 may be made of a dielectric material, such as a rubberized material, to allow electrical isolation between the support member 220 and the mezzanine card 110.

FIGS. 8-11 show various additional embodiments of carrier cards 106b-106e with shock absorbing systems 120b-120e in which support members 120 are arranged in various configurations consistent with the present disclosure. According to one embodiment, the shock absorbing system 120b (FIG. 8) may include a single row of support members 220 with each support member 220 extending across one of the mezzanine card sites 204. According to another embodiment, the shock absorbing system 120c (FIG. 9) may include multiple support members 220 in each of the mezzanine card sites 204 with each support member 220 extending across a smaller portion of each mezzanine card site 204. According to a further embodiment, the shock absorbing system 120d (FIG. 10) may include single support members 220 extending across multiple mezzanine card sites 204 with a notch 226 in each support member 220 to accommodate a guide rail (not shown) between the mezzanine card sites 204. According to yet another embodiment, the shock absorbing system 120e (FIG. 11) may include support members 220 oriented at an angle across each of the mezzanine sites 204 and without rollers mounted on the support members 220.

Those skilled in the art will recognize that various other embodiments and configurations may be used to provide reinforcement of a carrier card and/or additional support for mezzanine card(s) connected to the carrier card. Those skilled in the art will recognize that the design of the shock absorbing system may depend on the weight of the mezzanine cards. When used with AdvancedMC modules, for example, the maximum mass for a single-width half-height module may be 175 grams, the maximum mass for a single-width full-height module and a double-width half-height module may be 350 grams, and the maximum mass for a double-width full-height module may be 700 grams.

According to various alternative embodiments, a shock absorbing system consistent with the present disclosure may be used with circuit boards other than a carrier card and a mezzanine card. The shock absorbing system may be used on any circuit board that is located adjacent another circuit board with relatively close tolerances. For example, the shock absorbing system may be used on one or more neighboring circuit boards (or blades) connected to a backplane (e.g., in an ATCA chassis). In another example, the shock absorbing system may be used on one or more mezzanine cards that are mounted adjacent one another (e.g., half-height AdvancedMC modules in A and B layers on an AdvancedMC carrier). The shock absorbing system may be used in any computer or electronic system that may be subject to shock and/or vibrations, for example, caused by shipping or transporting the electronic system or by earthquakes or other such events.

Figure 12:
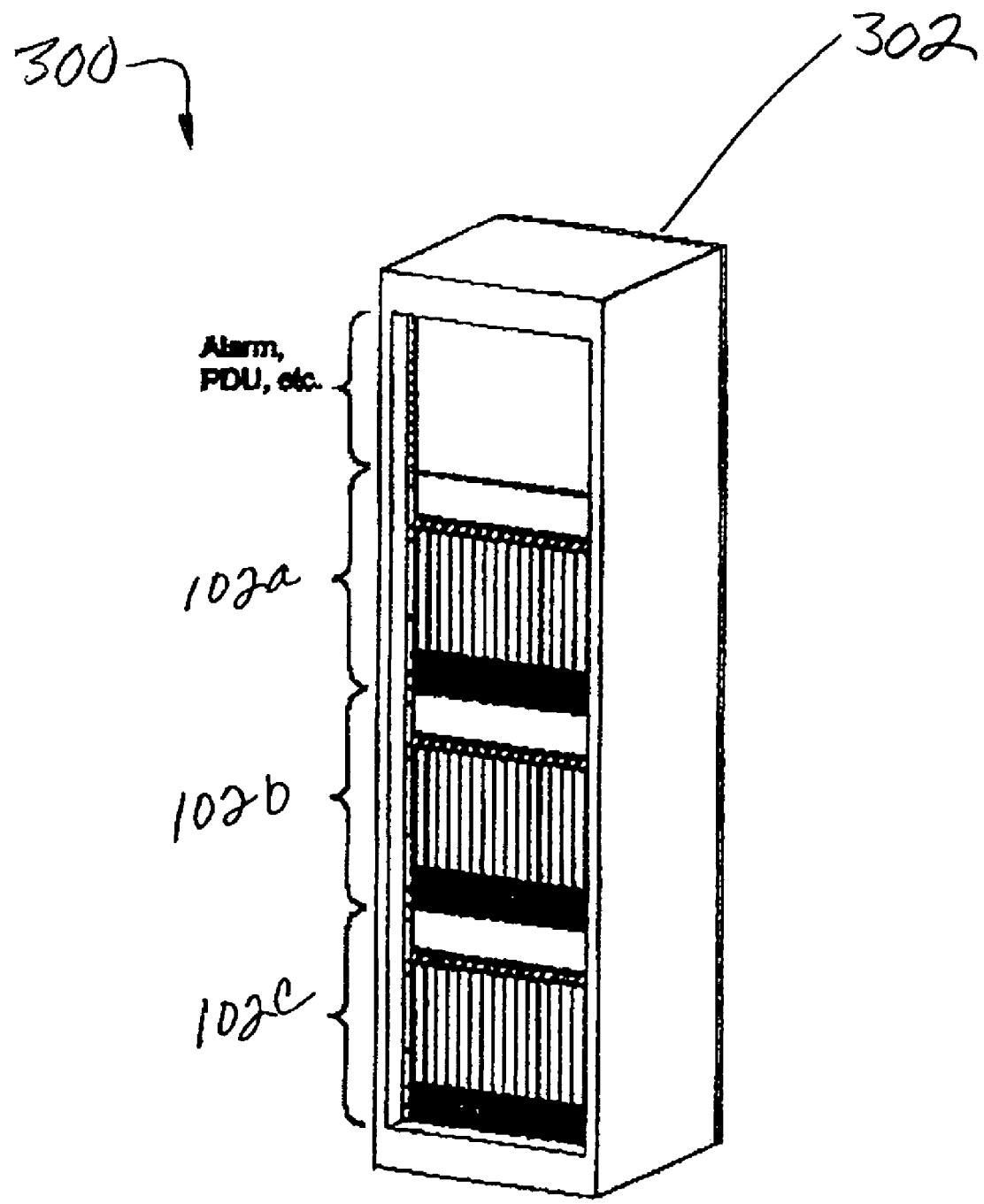
FIG. 12 is an embodiment of a cabinet that may be suitably employed in connection with the present disclosure.

Referring to FIG. 12, a system 300 consistent with the present disclosure is illustrated. As depicted, the system 300 may include a frame or cabinet 302. The cabinet 302 may accommodate and electrically couple a plurality of chassis 102A, 102B, and 102C. One or more of the chassis 102A, 102B, 102C may include at least one circuit board which may be coupled to at least one card consistent with any embodiment described herein. The cabinet 302 may include, for example, a power supply for providing power to each of the individual chassis 102A, 102B, 102C disposed in the cabinet 302, etc. Additionally, as mentioned above, the cabinet 302 may electrically couple one or more of the chassis 102A, 102B, 102C to at least one other chassis.

According to an alternative embodiment, rather than being disposed in a common cabinet, a system consistent with the present disclosure may include a plurality of chassis that may be individually hardwired to one another. One or more of the plurality of chassis may include at least one circuit board coupled to at least one card consistent with any embodiment described herein. Additionally, each of the plurality of chassis may be powered by an individual power supply and/or may be separately powered by a common power supply. Such a system may, therefore, provide a greater freedom in the physical arrangement and interrelation of the plurality of chassis.

Thus, one embodiment of a system consistent with the present disclosure may include a cabinet comprising at least one chassis, at least one carrier card capable of being at least partially disposed within the chassis, and at least one Advanced Mezzanine Card (AdvancedMC) capable of being coupled to the carrier card. The carrier card may include at least one carrier card component and the AdvancedMC may include at least one AdvancedMC component. A shock absorbing system may be mounted to the carrier card and may extend across at least a portion of the carrier card. The shock absorbing system may extend above the carrier card component and may be configured to absorb a shock force from the AdvancedMC component on the AdvancedMC.

Consistent with another embodiment, a system may include at least first and second circuit boards positioned adjacent each other. The first circuit board may include at least a first component on a surface thereof and the second circuit board may include at least a second component on a surface thereof. The first and second circuit boards may be positioned such that a clearance exists between the first and second components. The system may also include a shock absorbing system mounted to at least one of the first and second circuit boards. The shock absorbing system may extend into the clearance between the first and second components and may be configured to prevent the first and second components from contacting each other.

Consistent with a further embodiment, an apparatus may include a carrier card including at least one carrier card component and at least one mezzanine card connector corresponding to at least one mezzanine card site on the carrier card, which may be configured to receive a mezzanine card. The apparatus may also include a shock absorbing system mounted to the carrier card and extending across at least a portion of the mezzanine card site. The shock absorbing system may extend above the carrier card component and may be configured to absorb a shock force from a mezzanine card component on the mezzanine card.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

What is claimed is:

1. A system comprising:
    a cabinet comprising at least one chassis;
    at least one carrier card capable of being at least partially disposed within said chassis, said carrier card including at least one carrier card component;
    at least one Advanced Mezzanine Card (AdvancedMC) capable of being coupled to said carrier card, said AdvancedMC including at least one AdvancedMC component; and
    a shock absorbing system comprising at least one support member mounted to said carrier card and extending across at least a portion of said carrier card and at least one roller rotatably mounted on said support member, wherein said shock absorbing system extends from said carrier card component to a clearance between said AdvancedMC component and said carrier card component, and wherein said at least one roller is configured to substantially only contact said AdvancedMC if said AdvancedMC is displaced toward said carrier card due to a shock force.

2. The system of claim 1 wherein said carrier card includes a plurality of AdvancedMC sites, and wherein said shock absorbing system comprises a plurality of support members, one of said support members being located in one of said AdvancedMC sites.

3. The system of claim 2 wherein a plurality of said support members are located in one of said AdvancedMC sites.

4. The system of claim 1 wherein said carrier card includes a plurality of AdvancedMC sites, and wherein said shock absorbing system comprises at least one support member extending across said plurality of AdvancedMC sites.

5. The system of claim 1 wherein said shock absorbing system comprises at least one support member made of a conductive material, and wherein said support member is configured to be used as a power distribution bus bar on said carrier card.

6. A system comprising:
    at least first and second circuit boards positioned substantially adjacent each other, said first circuit board including at least a first component on a surface thereof and said second circuit board including at least a second component on a surface thereof, wherein said first and second circuit boards are positioned such that a clearance exists between said first and second components; and
    a shock absorbing system comprising at least one support member mounted to said first circuit boards and at least one roller rotatably mounted on said support member, wherein said shock absorbing system extends into said clearance between said first and second components, and wherein said at least one roller substantially only contacts said second components when said second circuit board is displaced toward said first circuit board due to a shock force.

7. The system of claim 6 wherein said shock absorbing system extends across at least a portion of said first circuit board and is configured to reinforce said first circuit board.

8. An apparatus comprising:
    a carrier card including at least one carrier card component and at least one mezzanine card connector corresponding to at least one mezzanine card site on said carrier card, said mezzanine card site being configured to receive a mezzanine card; and
    a shock absorbing system comprising at least one support member mounted to said carrier card and extending across at least a portion of said mezzanine card site and at least one roller rotatably mounted on said support member, wherein said shock absorbing system extends from said carrier card and beyond said carrier card component, and wherein said at least one roller substantially only contacts a mezzanine card component on said mezzanine card when said mezzanine card is displaced toward said carrier card due to a shock force.

9. The apparatus of claim 8 wherein said support member is mounted such that said support member is raised above a surface of said carrier card.

10. The apparatus of claim 8 wherein said support member includes mounting structures at each end to engage said carrier card.

11. The apparatus of claim 10 wherein said support member includes mounting structures on each side of said roller to engage said carrier card.

12. The apparatus of claim 8 wherein said support member is configured to be used as a power distribution bus bar on said carrier card.

13. The apparatus of claim 12 wherein said roller is made of a dielectric material.

14. The apparatus of claim 8 wherein said carrier card is an Advanced Mezzanine Card (AdvancedMC) carrier card and said mezzanine connector is an AdvancedMC connector.

15. The apparatus of claim 8 wherein said shock absorbing system comprises a plurality of support members.

16. The apparatus of claim 10 wherein said carrier card includes a plurality of mezzanine card sites, and wherein each of said support members extends across a respective one of said mezzanine card sites.

17. The apparatus of claim 10 wherein said carrier card includes a plurality of mezzanine card sites, and wherein each of said mezzanine card sites on said carrier card includes a plurality of said support members spaced from one another.

18. The apparatus of claim 8 wherein said carrier card includes a plurality of mezzanine card sites, and wherein said shock absorbing system includes at least one support member extending across said plurality of mezzanine card sites.

19. An apparatus comprising:
    a carrier card including at least one carrier card component and a plurality of mezzanine card connectors corresponding to a plurality of mezzanine card sites on said carrier card, said mezzanine card sites being configured to receive mezzanine cards; and
    a shock absorbing system configured to contact a mezzanine card component on said mezzanine cards when said mezzanine card is displaced toward said carrier card due to a shock force, said shock absorbing system comprising:

a plurality of support bars mounted to said carrier card such that said support bar is raised from said carrier card and extends across at least a portion of respective said mezzanine card sites, wherein each of said support bars include curved ends and a plurality of curved side supports extending from each side of said support bar; and at least one roller rotatably mounted on each of said support bars between said curved side supports, said roller being made of an elastomeric material, and wherein said support bar extends from said carrier card such that an outer surface of said roller is located beyond said carrier card component.

* * * * *